(12) United States Patent
Saito et al.

(10) Patent No.: US 10,739,043 B2
(45) Date of Patent: Aug. 11, 2020

(54) CONVEYING DEVICE

(71) Applicant: JTEKT CORPORATION, Osaka-shi (JP)

(72) Inventors: Toshiyuki Saito, Kashiba (JP); Ryouichi Takahata, Kitakatsuragi-gun (JP); Tomoyuki Takei, Nara (JP); Masashi Hattori, Tenri (JP)

(73) Assignee: JTEKT CORPORATION, Osaka-shi (JP)

( * ) Notice: Subject to any disclaimer, the term of this patent is extended or adjusted under 35 U.S.C. 154(b) by 82 days.

(21) Appl. No.: 15/706,306

(22) Filed: Sep. 15, 2017

(65) Prior Publication Data

US 2018/0073781 A1 Mar. 15, 2018

(30) Foreign Application Priority Data

Sep. 15, 2016 (JP) .................. 2016-180692

(51) Int. Cl.
*F25B 9/14* (2006.01)
*H01L 23/00* (2006.01)

(52) U.S. Cl.
CPC .............. *F25B 9/145* (2013.01); *H01L 24/75* (2013.01); *F25B 2309/1403* (2013.01); *H01L 2224/755* (2013.01); *H01L 2224/7525* (2013.01); *H01L 2224/75251* (2013.01); *H01L 2224/75501* (2013.01); *H01L 2224/75651* (2013.01)

(58) Field of Classification Search
CPC .. F25B 9/145; F25B 2309/1403; H01L 24/75; H01L 2224/7525; H01L 2224/75251; H01L 2224/755; H01L 2224/5501; H01L 2224/75651

See application file for complete search history.

(56) References Cited

U.S. PATENT DOCUMENTS

2005/0091974 A1* 5/2005 Carnahan .............. F02G 1/0435
60/517
2016/0076794 A1 3/2016 Saito

FOREIGN PATENT DOCUMENTS

| JP | 2000-205677 A | 7/2000 |
|----|---------------|--------|
| JP | 2003-117770 A | 4/2003 |
| JP | 2007-263500 A | 10/2007 |
| JP | 2009-081375 A | 4/2009 |
| JP | 2011-208507 A | 10/2011 |
| JP | 2014-222128 A | 11/2014 |
| JP | 2016-200304 A | 12/2016 |

OTHER PUBLICATIONS

Search Report dated Apr. 24,2020 in Japanese Patent Application No. 2016-180692 (with English translation).

* cited by examiner

*Primary Examiner* — Brian M King
(74) *Attorney, Agent, or Firm* — Oblon, McClelland, Maier & Neustadt, L.L.P.

(57) ABSTRACT

In a conveying device, a belt conveyer is equipped with a conveying portion that conveys an object from an upstream region to a downstream region. A heat source heats the conveyed object. A cooling portion is located downstream of a terminal end of the belt conveyor and cools the object. A first thermoacoustic cooling device cools the cooling portion. A first prime mover generates acoustic waves from heat transmitted from the first heat source. A first receiver generates, from the acoustic waves, cooling heat corresponding to a cooling temperature that is lower than a temperature of the heat source.

8 Claims, 9 Drawing Sheets

CONVEYING DEVICE

INCORPORATION BY REFERENCE

The disclosure of Japanese Patent Application No. 2016-180692 filed on Sep. 15, 2016 including the specification, drawings and abstract is incorporated herein by reference in its entirety.

BACKGROUND

1. Technical Field

The disclosure relates to a conveying device that conveys an object.

2. Description of Related Art

In a process of manufacturing, for example, a semiconductor device, an electronic component such as a semiconductor element or the like is soldered to a printed-circuit board with a solder, and reflow is then carried out. Reflow is a process of heating the printed-circuit board to which the semiconductor element is soldered, melting the solder again, and then cooling the heated printed-circuit board. The reliability of the connection between the semiconductor element and the printed-circuit board can be enhanced.

A reflow furnace that heats a printed-circuit board while conveying the printed-circuit board through the use of a belt conveyor is disclosed in Japanese Patent Application Publication No. 9-97976 (JP 9-97976 A). In the reflow furnace according to Japanese Patent Application Publication No. 9-97976 (JP 9-97976 A), an upper heater is provided facing a conveying surface of a conveying belt of the belt conveyor. A lower heater is provided in a space that is surrounded by the conveying belt. The printed-circuit board is heated by the upper heater and the lower heater while being conveyed by the belt conveyor.

A cooling device that is used to cool the printed-circuit board is installed on a terminal end side of the belt conveyor. For the purpose of, for example, preventing the solder that has melted through reheating from flowing out, the cooling device is arranged close to the terminal end of the belt conveyor. However, the heaters that are provided in the reflow furnace are arranged close to the cooling device. Thus, there is a problem in that the energy efficiencies (the mechanical efficiencies) of the heaters and the cooling device decrease.

SUMMARY

The disclosure provides a conveying device capable of preventing a decrease in energy efficiency (the mechanical efficiency).

A conveying device according to the present disclosure is equipped with a conveying portion, a first heat source, a cooling portion, and a first thermoacoustic cooling device. The conveying portion conveys an object from an upstream region to a downstream region. The first heat source heats the object conveyed by the conveying portion. The cooling portion is located downstream of a terminal end of the conveying portion in a case where a downstream direction is defined as a direction from a leading end of the conveying portion toward the terminal end thereof, and cools the object conveyed by the conveying portion. The first thermoacoustic cooling device cools the cooling portion. The first thermoacoustic cooling device is equipped with a first prime mover and a first receiver. The first prime mover is configured such that acoustic waves are generated from heat transmitted from the first heat source, by a thermoacoustic phenomenon. The first receiver is configured such that, from the acoustic waves, cooling heat corresponding to a cooling temperature that is lower than a temperature of the first heat source is generated, by the thermoacoustic phenomenon. The cooling portion is cooled by the cooling heat.

According to the present disclosure, the energy efficiency of the conveying device can be significantly enhanced.

BRIEF DESCRIPTION OF THE DRAWINGS

Features, advantages, and technical and industrial significance of exemplary embodiments of the disclosure will be described below with reference to the accompanying drawings, in which like numerals denote like elements, and wherein.

DETAILED DESCRIPTION OF EMBODIMENTS

Figure 1:
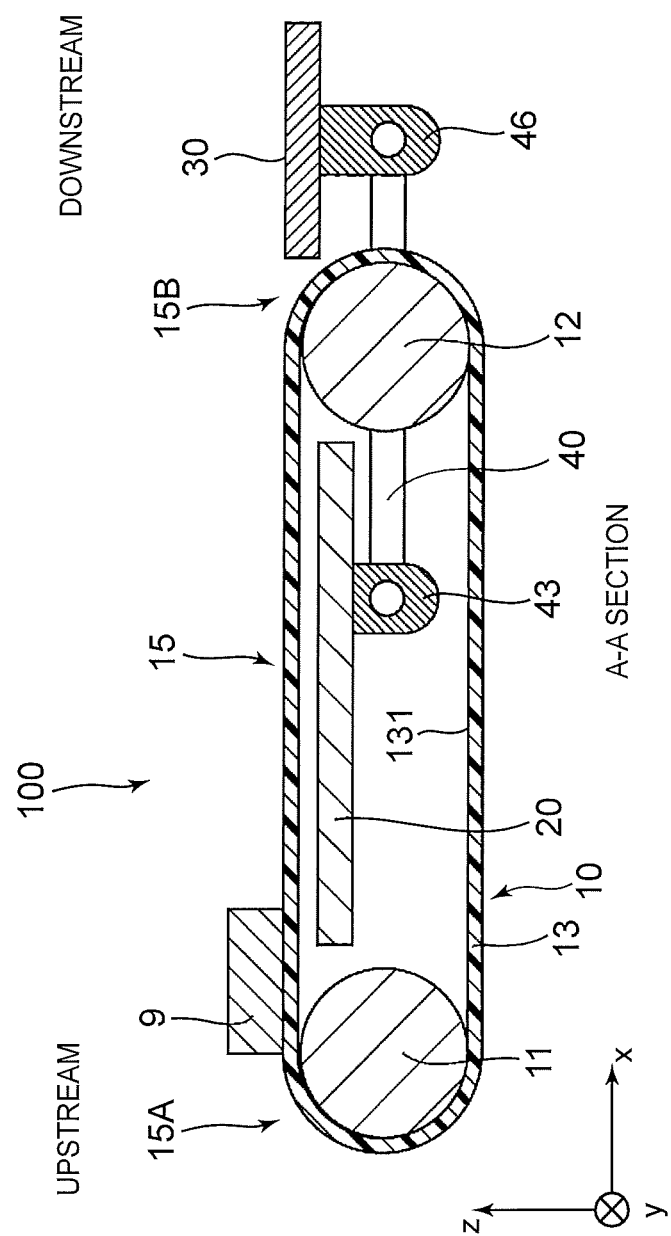
FIG. 1 is a lateral sectional view of a conveying device according to the first embodiment of the disclosure.

A conveying device according to the embodiments of the disclosure is equipped with a conveying portion, a first heat source, a cooling portion, and a first thermoacoustic cooling device. The conveying portion conveys an object from an upstream region to a downstream region. The first heat source is arranged below the conveying portion, and heats the object conveyed by the conveying portion. The cooling portion is located downstream of a terminal end of the conveying portion in a case where a downstream direction is defined as a direction from a leading end of the conveying portion toward the terminal end thereof, and cools the object conveyed by the conveying portion. The first thermoacoustic cooling device cools the cooling portion. The first thermoacoustic cooling device is equipped with a first acoustic tube, a first prime mover, and a first receiver. The first acoustic tube has at least one annular structure. The first prime mover is arranged in the first acoustic tube in such a manner as to be located below the conveying portion, and is configured such that acoustic waves are generated from heat transmitted from the first heat source by a thermoacoustic phenomenon. The first receiver is configured such that, from the acoustic waves, cooling heat corresponding to a cooling temperature that is lower than a temperature of the first heat source is generated, by the thermoacoustic phenomenon. The cooling portion is cooled by the cooling heat (a first configuration).

According to the aforementioned conveying device, the first heat source heats the object conveyed by the conveying portion. The first thermoacoustic cooling device cools the cooling portion by being driven by the heat generated by the heat source. Thus, the conveying device is not required to be equipped with a drive source for cooling the cooling portion separately from the first heat source that heats the object, so the energy efficiency (the machine efficiency) can be significantly enhanced.

In the aforementioned conveying device, the first thermoacoustic cooling device may be further equipped with a first driving heat conductor and a first cooling heat conductor. The first driving heat conductor is thermally connected to the first heat source. The first cooling heat conductor is thermally connected to the cooling portion. The first prime mover is equipped with a first prime mover stack, a first heater, and a first prime mover reference temperature adjuster. The first prime mover stack exchanges heat with a gas in the first acoustic tube. The first heater is provided at one end of the first prime mover stack, and is thermally connected to the first driving heat conductor. The first prime mover reference temperature adjuster is provided at the other end of the first prime mover stack, and a temperature thereof is adjusted to a first reference temperature that is lower than a temperature of the first heat source. The first receiver is equipped with a first receiver stack, a first receiver reference temperature adjuster, and a first cooler. The first receiver stack exchanges heat with the gas in the first acoustic tube. The first receiver reference temperature adjuster is provided at one end of the first receiver stack. The first cooler is provided at the other end of the first receiver stack, and is thermally connected to the first cooling heat conductor (a second configuration).

According to the second configuration, the heat of the first heat source is converted into acoustic waves by a temperature gradient that is created in the first prime mover stack. The acoustic waves cool the first cooler by creating the temperature gradient in the second prime mover stack. The first cooler is thermally connected to the cooling portion via the first cooling heat conductor, so the cooling portion can be cooled.

In the aforementioned conveying device, an outer periphery of the first acoustic tube may be covered with a heat insulating material (a third configuration).

According to the third configuration, the temperature of the gas in the first acoustic tube can be restrained from rising due to the heat from the heat source. The wavelength of the sound that is generated in the first acoustic tube can be prevented from changing due to a rise in the temperature of the gas, so the cooling function of the first thermoacoustic cooling device can be maintained.

The aforementioned conveying device may be further equipped with a second heat source and a second thermoacoustic cooling device. The second heat source is arranged below the conveying portion, and heats the object conveyed by the conveying portion. The second thermoacoustic cooling device adjusts a temperature of the first prime mover reference temperature adjuster to the first reference temperature. The second thermoacoustic cooling device is equipped with a second driving heat conductor, a second cooling heat conductor, a second acoustic tube, a second prime mover, and a second receiver. The second driving heat conductor is thermally connected to the second heat source. The second cooling heat conductor is thermally connected to the first prime mover reference temperature adjuster. The second acoustic tube has at least one annular structure. The second prime mover is arranged in the second acoustic tube in such a manner as to be located below the conveying portion. The second receiver is arranged in the second acoustic tube in such a manner as to be located below the conveying portion. The second prime mover is equipped with a second prime mover stack, a second heater, and a second prime mover reference temperature adjuster. The second prime mover stack exchanges heat with a gas in the second acoustic tube. The second heater is provided at one end of the second prime mover stack, and is thermally connected to the second driving heat conductor. The second prime mover reference temperature adjuster is provided at the other end of the second prime mover stack, and a temperature thereof is adjusted to a second reference temperature that is lower than a temperature of the second heat source. The second receiver is equipped with a second receiver stack, a second receiver reference temperature adjuster, and a second cooler. The second receiver stack exchanges heat with a gas in the second acoustic tube. The second receiver reference temperature adjuster is provided at one end of the second receiver stack. The second cooler is provided at the other end of the second receiver stack, and is thermally connected to the second cooling heat conductor (a fourth configuration).

According to the fourth configuration, the second thermoacoustic cooling device cools the first prime mover reference temperature adjuster by being driven by the heat from the second heat source. The fourth configuration can make the temperature gradient created in the first prime mover stack steeper than in the case where only the first thermoacoustic cooling device is used. Thus, the cooling portion can be further cooled without adding a heat source other than the heat sources for heating the object.

In the aforementioned conveying device, an outer periphery of the second acoustic tube may be covered with a heat insulating material (a fifth configuration).

In the fifth configuration, the temperature of the gas in the second acoustic tube is restrained from rising due to the heat from the heat sources. The wavelength of the sound that is generated in the second acoustic tube can be prevented from changing due to a rise in the temperature of the gas, so the cooling function of the second thermoacoustic cooling device can be maintained.

In the aforementioned conveying device, the heat source may be arranged between the first prime mover and the conveying portion (a sixth configuration).

In the sixth configuration, the heat emitted upward by the heat source is used to heat the object, and the heat emitted downward by the heat source is used to drive the first thermoacoustic cooling device. The heat emitted by the heat source can be effectively utilized, so the energy efficiency of the conveying device can be further enhanced.

The embodiments of the disclosure will be described hereinafter in detail with reference to the drawings. In the drawings, like or same components as components that are explained in the other drawings will be denoted by like or same reference symbols, and the description thereof will not be repeated. For the convenience of explanation, the configurations of the embodiments of the disclosure may be simplified, typified or partially omitted in the respective drawings.

First Embodiment

{Configuration of Conveying Device 100}

Figure 2:
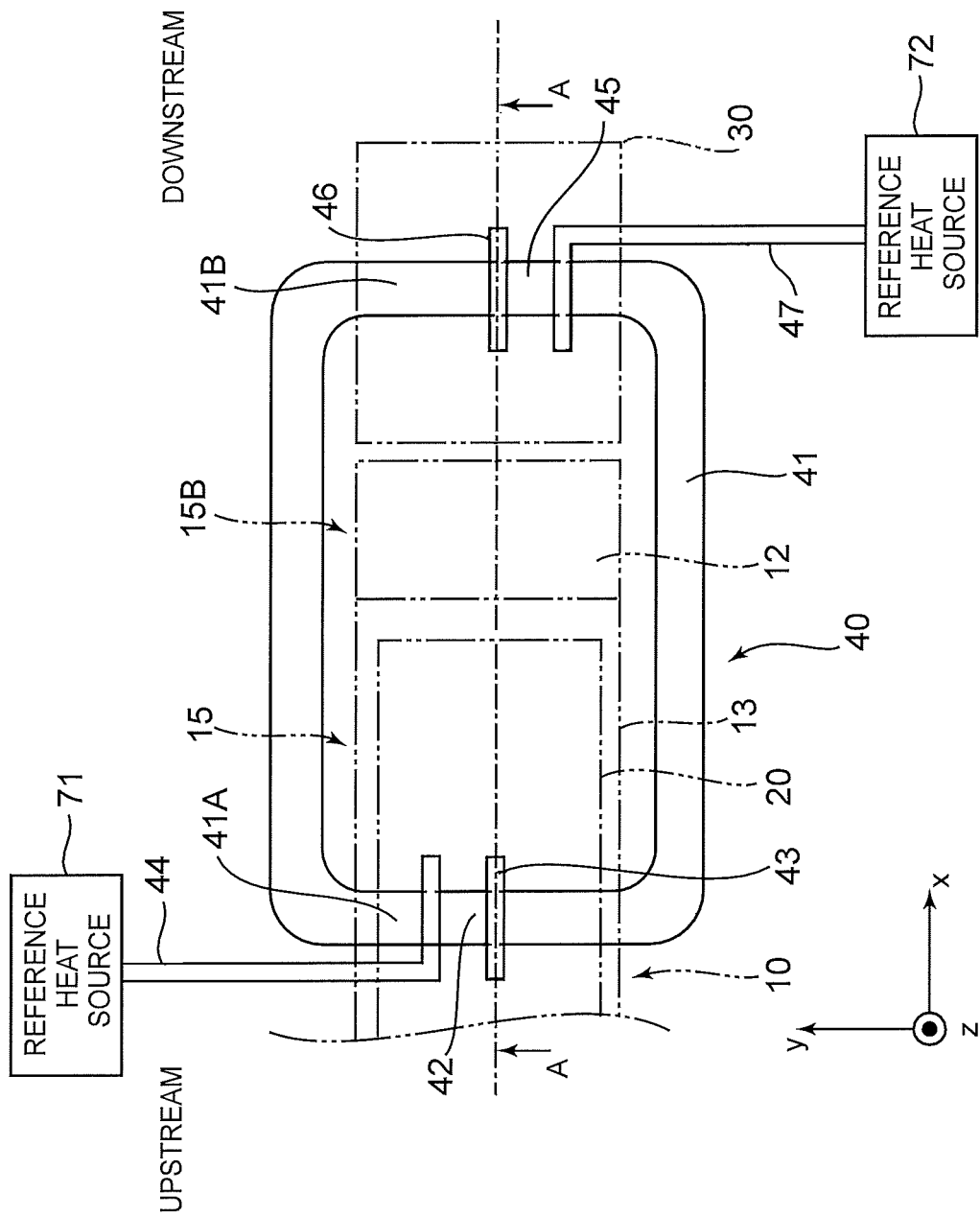
FIG. 2 is a plan view of a first thermoacoustic cooling device shown in FIG. 1.

FIG. 1 is a lateral sectional view of a conveying device 100 according to the first embodiment of the disclosure. FIG. 2 is a plan view of a first thermoacoustic cooling device 40 shown in FIG. 1. The lateral sectional view of the conveying device 100 shown in FIG. 1 is equivalent to an A-A sectional view shown in FIG. 2.

In the following description, an x-axis is defined as a direction from an upstream region toward a downstream region in the belt conveyor 10, a y-axis is defined as a width direction in the belt conveyor 10, and a z-axis is defined as an upward direction in the belt conveyor 10.

The conveying device 100 shown in FIG. 1 is a reflow device that carries out the reflowing of a solder for a semiconductor device 9. The semiconductor device 9 is a printed-circuit board to which a semiconductor element is soldered.

The conveying device 100 is equipped with the belt conveyor 10, a heat source 20, a cooling portion 30 and a first thermoacoustic cooling device 40.

In the belt conveyor 10, a conveying portion 15 conveys the semiconductor device 9 from the upstream region to the downstream region. In concrete terms, the semiconductor device 9 is conveyed by the conveying portion 15 from a leading end 15A as an upstream end portion of the conveying portion 15 to a terminal end 15B as a downstream end portion thereof.

The belt conveyor 10 is equipped with a head pulley 11, a tail pulley 12 and an endless belt 13. The head pulley 11 is arranged at the leading end 15A. The tail pulley 12 is arranged at the terminal end 15B. The endless belt 13 is bridged between the head pulley 11 and the tail pulley 12. In the belt conveyor 10, a region where the semiconductor device 9 can be placed constitutes the conveying portion 15.

The heat source 20 is arranged below the conveying portion 15. That is, the heat source 20 is arranged in an inner space of the belt conveyor 10, namely, a space that is surrounded by an inner peripheral surface 131 of the endless belt 13. The heat source 20 is located between the head pulley 11 and the tail pulley 12. The heat source 20 heats, from below, the semiconductor device 9 that is conveyed by the conveying portion 15.

In the case where the downstream direction is defined as a direction from the leading end 15A of the conveying portion 15 toward the terminal end 15B thereof, the cooling portion 30 is arranged downstream of the terminal end 15B. The cooling portion 30 is equipped with a pedestal on which the semiconductor device 9 that has been conveyed to the terminal end 15B is to be placed. This pedestal is formed of a material exhibiting high heat conductivity. The cooling portion 30 is cooled by the first thermoacoustic cooling device 40.

As shown in FIG. 2, the first thermoacoustic cooling device 40 is constituted by a thermoacoustic engine that is equipped with a single loop tube. The first thermoacoustic cooling device 40 is driven by the heat supplied from the heat source 20, and cools the cooling portion 30. The configuration of the first thermoacoustic cooling device 40 will be described later.

The semiconductor device 9 is heated by the heat source 20 while being conveyed from the leading end 15A to the terminal end 15B by the conveying portion 15. In the semiconductor device 9, the solder that connects the printed-circuit board and the semiconductor element to each other melts due to the heat from the heat source 20.

Upon reaching the terminal end 15B, the semiconductor device 9 is placed on the cooling portion 30. The first thermoacoustic cooling device 40 cools the cooling portion 30, so the semiconductor device 9 is cooled by the cooling portion 30. In the semiconductor device 9, the solder that has melted due to the heat from the heat source 20 solidifies into an appropriate crystal structure exhibiting high resistance to deformation and rupture, by being rapidly cooled by the cooling portion 30. Thus, the reliability of the solder that connects the printed-circuit board and the semiconductor element to each other in the semiconductor device 9 can be enhanced.

{Configuration of First Thermoacoustic Cooling Device 40}

As shown in FIG. 2, the first thermoacoustic cooling device 40 is equipped with a first acoustic tube 41, a first prime mover 42, a first driving heat conductor 43, first reference heat conductors 44 and 47, a first receiver 45 and a first cooling heat conductor 46.

The first acoustic tube 41 is a hollow pipe consisting of a single loop in which a gas such as nitrogen, helium, argon or the like is encapsulated.

As shown in FIGS. 1 and 2, the first acoustic tube 41 is arranged parallel to an x-y plane, and partially passes through the inner space of the belt conveyor 10. In concrete terms, the first acoustic tube 41 has an intersection portion 41A and a non-intersection portion 41B that extend in the y-axis direction. The intersection portion 41A passes below the heat source 20. That is, the intersection portion 41A passes through the inner space of the belt conveyor 10, and perpendicularly intersects with the endless belt 13. The non-intersection portion 41B passes below the cooling portion 30. That is, the non-intersection portion 41B passes a position downstream of the terminal end of the belt conveyor 10.

The first prime mover 42 generates acoustic waves from the heat transmitted from the heat source 20, through the use of a thermoacoustic phenomenon. The acoustic waves generated by the first prime mover 42 are transmitted through the first acoustic tube. The first prime mover 42 is arranged in the first acoustic tube 41 in such a manner as to be located below the heat source 20. In concrete terms, the first prime mover 42 is arranged at the intersection portion 41A, and is located in the inner space of the belt conveyor 10. The heat source 20 is located between the first prime mover 42 and the conveying portion 15.

As shown in FIGS. 1 and 2, the first driving heat conductor 43 is in contact with a lower surface of the heat source 20, and thermally connects the heat source 20 and the first prime mover 42 to each other. The first reference heat conductor 44 thermally connects the first prime mover 42 and a reference heat source 71 to each other. The temperature of the reference heat source 71 is lower than the temperature of the heat source 20, and is equal to, for example, a room temperature. The first driving heat conductor 43 and the first reference heat conductor 44 are formed of a metal exhibiting high heat conductivity.

The first receiver 45 generates, from the acoustic waves generated by the first prime mover 42, cooling heat corresponding to a cooling temperature that is lower than the temperature of the heat source 20, through the use of the thermoacoustic phenomenon. The first receiver 45 is arranged in the first acoustic tube 41 in such a manner as to be located downstream of the terminal end 15B of the conveying portion 15. In concrete terms, the first receiver 45 is arranged at the non-intersection portion 41B, and is arranged at a position facing a lower surface of the cooling portion 30.

As shown in FIGS. 1 and 2, the first cooling heat conductor 46 thermally connects the cooling portion 30 and the first receiver 45 to each other. The cooling heat generated by the first receiver 45 is transmitted to the cooling portion 30 via the first cooling heat conductor 46, so the cooling portion 30 is cooled. The first reference heat conductor 47 thermally connects the first receiver 45 and a reference heat source 72 to each other. As is the case with the reference heat source 71, the temperature of the reference heat source 72 is equal to, for example, a room temperature. The first cooling heat conductor 46 and the first reference heat conductor 47 are formed of a metal exhibiting high heat conductivity.

Figure 3:
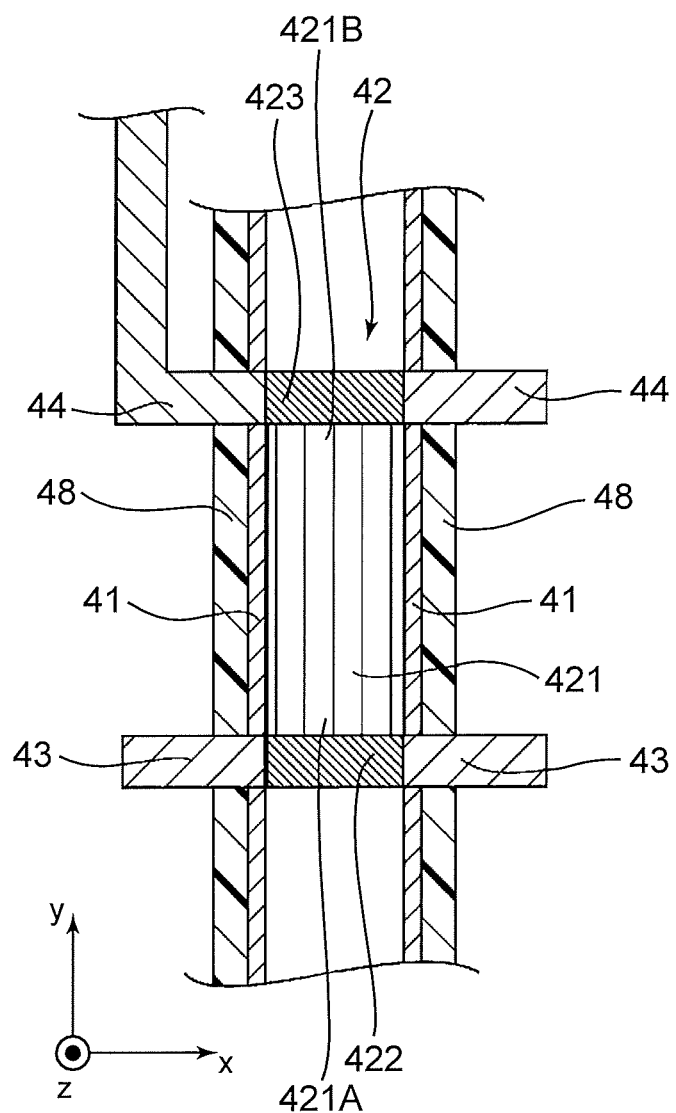
FIG. 3 is a plan sectional view of a first prime mover shown in FIG. 2.

FIG. 3 is a plan sectional view of the first prime mover 42 shown in FIG. 2. FIG. 3 is equivalent to a view obtained by cutting a region where the first prime mover 42 of the first thermoacoustic cooling device 40 shown in FIG. 2 is arranged, along a plane parallel to the xy-plane.

As shown in FIG. 3, a heat insulating material 48 covers an outer periphery of the first acoustic tube 41. The heat insulating material 48 is formed of an adiabatic material. Incidentally, the first driving heat conductor 43, the first reference heat conductors 44 and 47 and the first cooling heat conductor 46 may also be covered with the heat insulating material 48.

The first prime mover 42 is equipped with a stack 421, a first heater 422 and a reference temperature adjuster 423. Incidentally, the stack 421, the first heater 422 and the reference temperature adjuster 423 may be either integral with each other or separate from each other.

The stack 421 exchanges heat with the gas in the first acoustic tube 41. The stack 421 has a cylindrical shape, and has a diameter equal to an inner diameter of the first acoustic tube 41. A plurality of through-holes that penetrate the stack 421 from one end 421A thereof to the other end 421B thereof are formed inside the stack 421 in a meshed manner. Openings of the through-holes have, for example, a square or honeycomb shape.

The first heater 422 is a disc-shaped member having an outer diameter equal to the inner diameter of the first acoustic tube 41, and is provided at one end 421A of the stack 421. One end 421A is an end portion of the stack 421 in the opposite direction of a positive direction of the y-axis. An outer peripheral lateral surface of the first heater 422 is in contact with the first driving heat conductor 43. As is the case with the stack 421, a plurality of through-holes that penetrate the first heater 422 in the positive direction of the y-axis are formed inside the first heater 422 in a meshed manner.

The reference temperature adjuster 423 is a disc-shaped member having an outer diameter equal to the inner diameter of the first acoustic tube 41, and is provided at the other end 421B of the stack 421. The other end 421B is an end portion of the stack 421 in the positive direction of the y-axis. An outer peripheral lateral surface of the reference temperature adjuster 423 is in contact with the first reference heat conductor 44. As is the case with the stack 421, a plurality of through-holes that penetrate the reference temperature adjuster 423 in the positive direction of the y-axis are formed inside the reference temperature adjuster 423 in a meshed manner.

Figure 4:
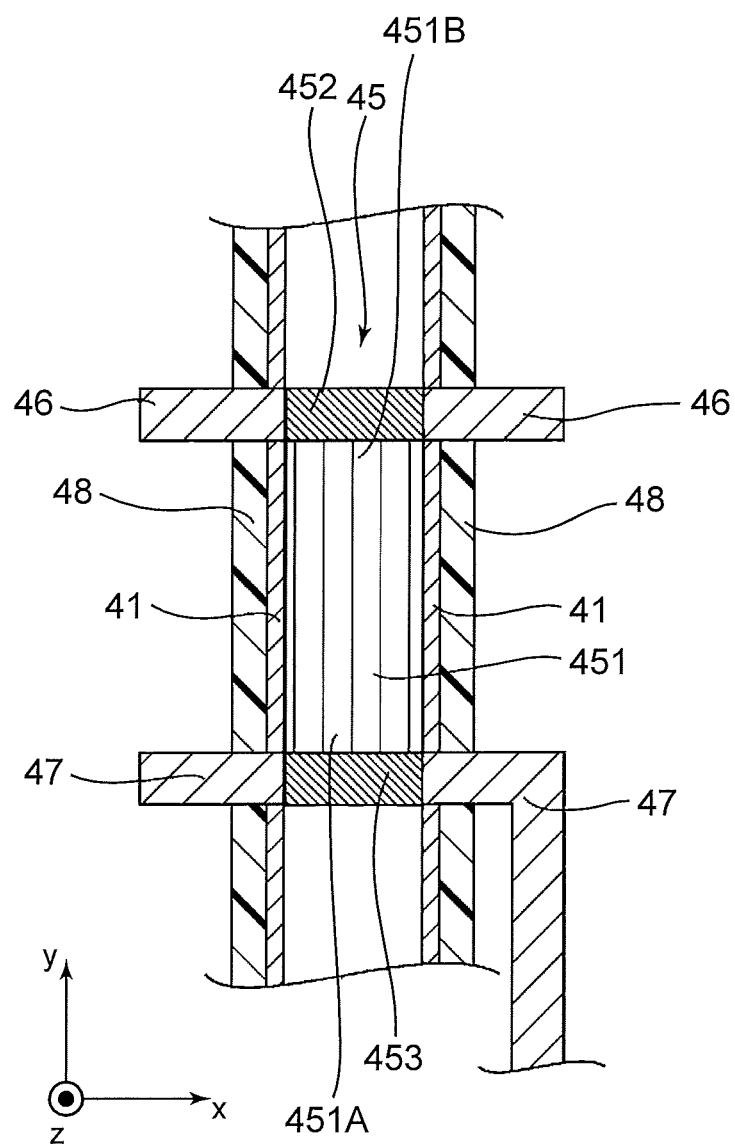
FIG. 4 is a plan sectional view of a first receiver shown in FIG. 2.

FIG. 4 is a plan sectional view of the first receiver 45 shown in FIG. 2. FIG. 4 is equivalent to a view obtained by cutting a region where the first receiver 45 of the first thermoacoustic cooling device 40 shown in FIG. 2 is arranged, along a plane parallel to the xy-plane.

The first receiver 45 is equipped with a stack 451, a first cooler 452 and a reference temperature adjuster 453. Incidentally, the stack 451, the first cooler 452 and the reference temperature adjuster 453 may be either integral with one another or separate from one another. The stack 451 exchanges heat with the gas in the first acoustic tube 41. The stack 451 is identical in structure to the stack 421, so detailed description thereof will be omitted.

The reference temperature adjuster 453 is a disc-shaped member having an outer diameter equal to the inner diameter of the first acoustic tube 41, and is provided at one end 451A of the stack 451. One end 451A is an end portion of the stack 451 in the opposite direction of the positive direction of the y-axis. An outer periphery of the reference temperature adjuster 453 is in contact with the first reference heat conductor 47. The reference temperature adjuster 453 is identical in structure to the reference temperature adjuster 423, so detailed description thereof will be omitted.

The first cooler 452 is a disc-shaped member having an outer diameter equal to the inner diameter of the first acoustic tube 41, and is provided at the other end 451B of the stack 451. The other end 451B is an end portion of the stack 451 in the positive direction of the y-axis. An outer peripheral lateral surface of the first cooler 452 is in contact with the first cooling heat conductor 46. The first cooler 452 is identical in structure to the first heater 422, so detailed description thereof will be omitted.

{Operation of First Thermoacoustic Cooling Device 40}

The operation of cooling the cooling portion 30 by the first thermoacoustic cooling device 40 will be described. First of all, the operation of the first prime mover 42 will be described. As shown in FIGS. 1 and 3, the first driving heat conductor 43 thermally connects the heat source 20 and the first heater 422 of the first prime mover 42 to each other. The first heater 422 heats one end 421A of the stack 421 by receiving, from the heat source 20, the heat whose temperature is capable of melting the solder, via the first driving heat conductor 43. For example, when the heating temperature of the heat source 20 is equal to 250° C., one end 421A is heated to a temperature close to 250° C., by using a good heat conductor to constitute the first driving heat conductor 43.

As shown in FIGS. 2 and 3, the first reference heat conductor 44 thermally connects the reference heat source 71 and the reference temperature adjuster 423 of the first prime mover 42 to each other. The reference temperature adjuster 423 receives, from the reference heat source 71, the heat corresponding to a first reference temperature that is lower than the temperature of the heat source 20, via the first reference heat conductor 44. Thus, the temperature of the reference temperature adjuster 423 is adjusted to the first reference temperature. As a result, the temperature of the other end 421B of the stack 421 is adjusted to the first reference temperature. For example, when the first reference temperature is equal to 25° C., the temperature of the other end 421B of the stack 421 is adjusted to 25° C.

As a result, in the stack 421, the temperature of one end 421A at which the first heater 422 is provided and the temperature of the other end 421B at which the reference temperature adjuster 423 is provided are different from each other. That is, a temperature gradient is created in the stack 421. Gas molecules encapsulated in the first acoustic tube 41 oscillate in the through-holes of the stack 421, due to the temperature gradient created in the stack 421. In this manner, the first prime mover 42 converts the heat transmitted from the heat source 20 into acoustic waves, through the use of the thermoacoustic phenomenon.

The oscillation of the gas molecules that occurs in the first prime mover 42 is transmitted to the first receiver 45. The gas molecules oscillate in the through-holes of the stack 451 in the first receiver 45. When the gas molecules move in the opposite direction of the positive direction of the y-axis due to the oscillation thereof, they are adiabatically compressed. The temperature of the gas molecules rises due to adiabatic compression. However, the temperature that has risen is absorbed by the stack 451. Subsequently, when the gas molecules move in the positive direction of the y-axis due to the oscillation thereof, the temperature of the gas molecules falls due to adiabatic expansion. The gas molecules repeatedly undergo adiabatic compression and adiabatic expansion in the through-holes of the stack 451, so the temperature of the gas molecules on the other end 451B side falls in the stack 451. As a result, the first cooler 452 is cooled.

The temperature of the first cooler 452 changes in accordance with the size of the first acoustic tube 41, the temperature gradient created in the first prime mover 42 and the like, but is lower than the temperature of the reference temperature adjuster 453 by, for example, about 15° C. In this case, when the temperature of the reference heat source 72 is equal to, for example, 25° C., the first cooler 452 is cooled to about 10° C. In this manner, the first receiver 45 generates, from acoustic waves transmitted from the first receiver 45, cooling heat corresponding to a cooling temperature that is lower than the temperature of the heat source 20, through the use of the thermoacoustic phenomenon.

As shown in FIGS. 1 and 4, the first cooler 452 is thermally connected to the cooling portion 30 via the first cooling heat conductor 46. The first cooler 452 is cooled as described above, so robs the cooling portion 30 of heat via the first cooling heat conductor 46. That is, the cooling portion 30 is cooled by the cooling heat generated by the first receiver 45. When the temperature of the reference heat source 72 is equal to 25° C. as in the aforementioned example, the cooling portion 30 is cooled to about 10° C.

As described hitherto, the first thermoacoustic cooling device 40 cools the cooling portion 30 by being driven by the heat generated by the heat source 20. The conveying device 100 is not required to be equipped with a drive source for cooling the cooling portion 30 separately from the heat source 20, so the energy efficiency of the reflowing of the solder can be significantly enhanced.

Besides, the heat source 20 is arranged between the first prime mover 42 of the first thermoacoustic cooling device 40 and the conveying portion 15 of the belt conveyor 10. The heat emitted upward by the heat source 20 is used to heat the semiconductor device 9, and the heat emitted downward by the heat source 20 is supplied to the first prime mover 42 via the first driving heat conductor 43. Accordingly, the conveying device 100 can more efficiently use the heat generated by the heat source 20.

Besides, the first acoustic tube 41 is covered with the heat insulating material 48. The heat insulating material 48 prevents the temperature of the gas molecules encapsulated in the first acoustic tube 41 from rising due to the heat from the heat source 20. When the temperature of the gas molecules rises, the speed of the sound generated in the first acoustic tube 41 changes. The wavelength of the sound generated in the first acoustic tube 41 changes in accordance with the speed of the sound, so the temperature of the first cooler 452 may not fall to a desired temperature due to the rise in the temperature of the gas molecules. The temperature of the gas molecules encapsulated in the first acoustic tube 41 is restrained from rising, by covering the first acoustic tube 41 with the heat insulating material 48. Therefore, the performance of the first thermoacoustic cooling device 40 can be maintained.

Second Embodiment

{Configuration of Conveying Device 200}

Figure 5:
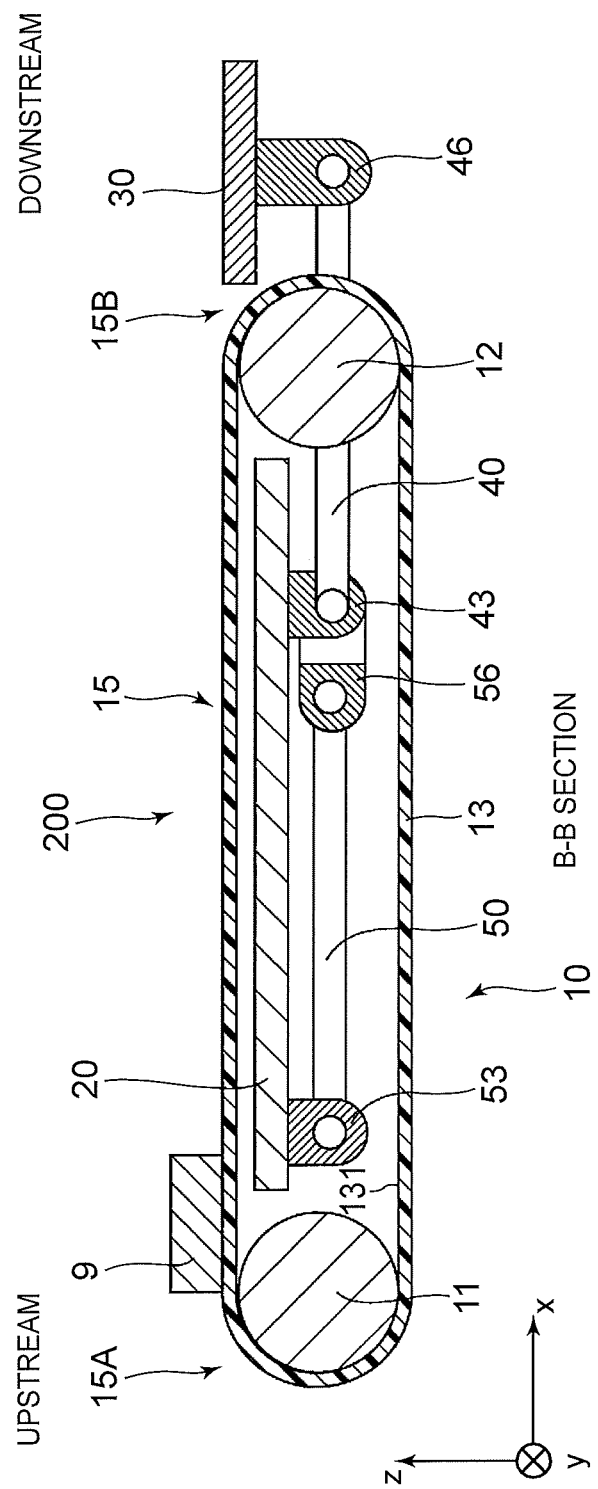
FIG. 5 is a lateral sectional view of a conveying device according to the second embodiment of the disclosure.
Figure 6:
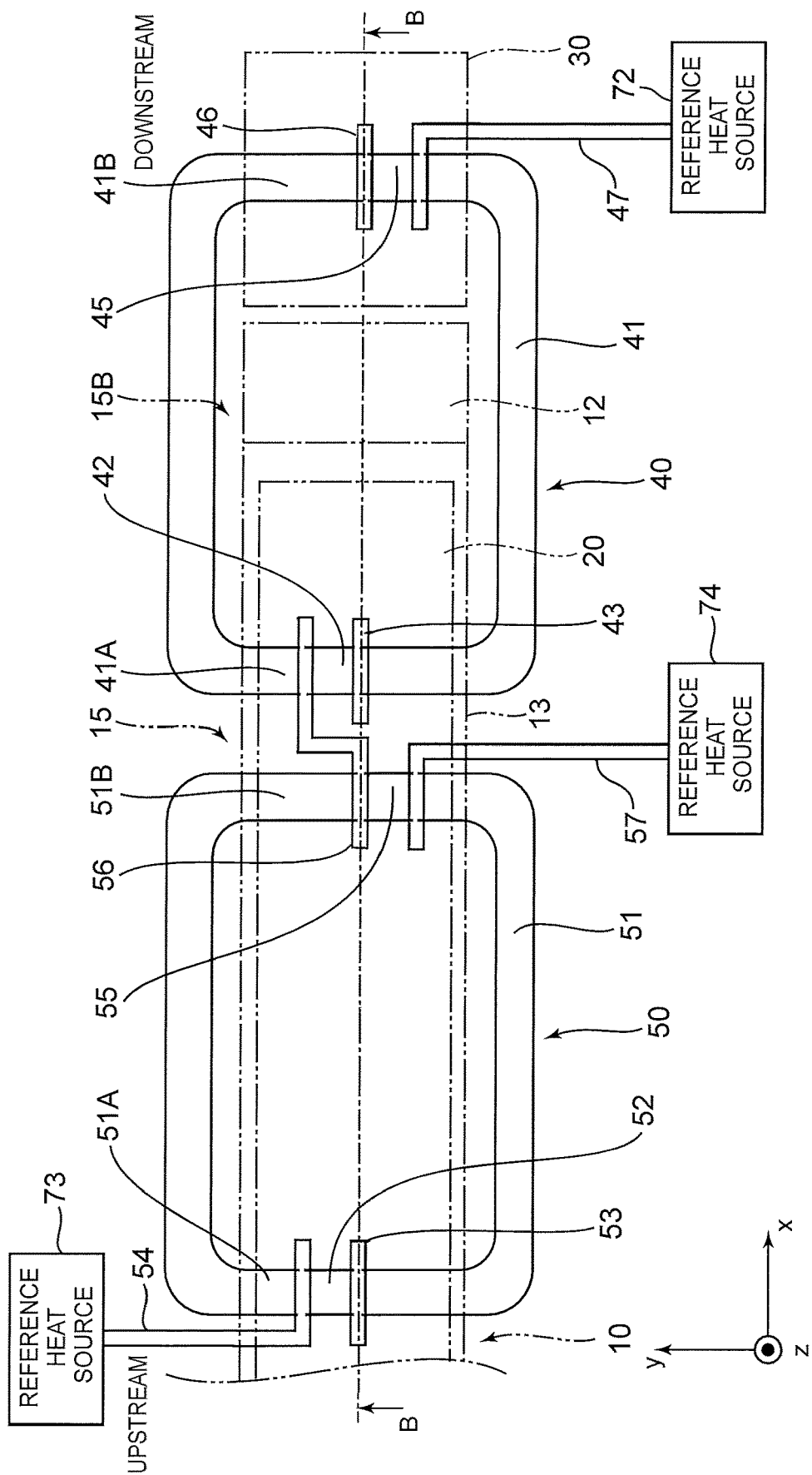
FIG. 6 is a plan view of a second thermoacoustic cooling device shown in FIG. 5.

FIG. 5 is a lateral sectional view of a conveying device 200 according to the second embodiment of the disclosure. FIG. 6 is a plan view of the first thermoacoustic cooling device 40 shown in FIG. 5 and a second thermoacoustic cooling device 50 shown in FIG. 5. The lateral sectional view of the conveying device 200 shown in FIG. 5 is equivalent to a B-B sectional view shown in FIG. 6.

In the following description, the x-axis will be defined as the direction from the upstream region toward the downstream region in the belt conveyor 10, the y-axis will be defined as the width direction in the belt conveyor 10, and the z-axis direction will be defined as the upward direction in the belt conveyor 10.

The conveying device 200 shown in FIG. 5 is different from the conveying device 100 shown in FIG. 1 as follows. That is, the conveying device 200 is further equipped with the second thermoacoustic cooling device 50 in addition to the components with which the conveying device 100 shown in FIG. 1 is equipped.

The second thermoacoustic cooling device 50 is constituted by a thermoacoustic engine that is equipped with a single loop tube. The second thermoacoustic cooling device 50 cools the reference temperature adjuster 423 with which the first prime mover 42 of the first thermoacoustic cooling device 40 is equipped, through the use of the heat supplied from the heat source 20.

As shown in FIG. 6, the second thermoacoustic cooling device 50 is equipped with a second acoustic tube 51, a second prime mover 52, a second driving heat conductor 53, second reference heat conductors 54 and 57, a second receiver 55, and a second cooling heat conductor 56.

As is the case with the first acoustic tube 41, the second acoustic tube 51 is a hollow pipe having a single loop, and a gas such as nitrogen, helium, argon or the like is encapsulated therein.

The second acoustic tube 51 is arranged parallel to the xy-plane. The second acoustic tube 51 is arranged in a space between the head pulley 11 and the first thermoacoustic cooling device 40, and is partially arranged below the heat source 20. In concrete terms, the second acoustic tube 51 extends in the y-axis direction, and has intersection portions 51A and 51B that perpendicularly intersect with the endless belt 13. The intersection portion 51A passes through the inner space of the belt conveyor 10, and is arranged at a position closer to the head pulley 11 than the intersection portion 51B. The intersection portion 51B passes through the inner space of the belt conveyor 10, and is arranged at a position closer to the first thermoacoustic cooling device 40 than the intersection portion 51A.

The second prime mover 52 generates acoustic waves from the heat transmitted from the heat source 20, through the use of the thermoacoustic phenomenon. The acoustic waves generated by the second prime mover 52 are transmitted through the second acoustic tube 51. The second prime mover 52 is arranged in the second acoustic tube 51 in such a manner as to be located below the heat source 20. In concrete terms, the second prime mover 52 is arranged at the intersection portion 51A, and is located in the inner space of the belt conveyor 10. The heat source 20 is located between the second prime mover 52 and the conveying portion 15.

As shown in FIGS. 5 and 6, the second driving heat conductor 53 is in contact with the lower surface of the heat source 20, and thermally connects the heat source 20 and the second prime mover 52 to each other. The second reference heat conductor 54 thermally connects the second prime mover 52 and a reference heat source 73 to each other. The temperature of the reference heat source 73 (a second reference temperature) is lower than the temperature of the heat source 20, and is equal to, for example, a room temperature. The second driving heat conductor 53 and the second reference heat conductor 54 are formed of a metal exhibiting high heat conductivity.

The second receiver 55 generates, from the acoustic waves transmitted through the second acoustic tube 51, heat corresponding to a temperature that is lower than the temperature of the heat source 20 and serving to cool the reference temperature adjuster 423 with which the first prime mover 42 is equipped, through the use of the thermoacoustic phenomenon. The second receiver 55 is arranged in the second acoustic tube 51 in such a manner as to be located below the heat source 20. In concrete terms, the second receiver 55 is arranged at the intersection portion 51B, and is located in the inner space of the belt conveyor 10.

The second cooling heat conductor 56 thermally connects the second receiver 55 and the first prime mover 42 of the first thermoacoustic cooling device 40 to each other. The second reference heat conductor 57 thermally connects the second receiver 55 and the reference heat source 74 to each other. The second cooling heat conductor 56 and the second reference heat conductor 57 are formed of a metal exhibiting high heat conductivity. As is the case with the reference heat source 71, the temperature of the reference heat source 74 is equal to, for example, a room temperature.

Figure 7:
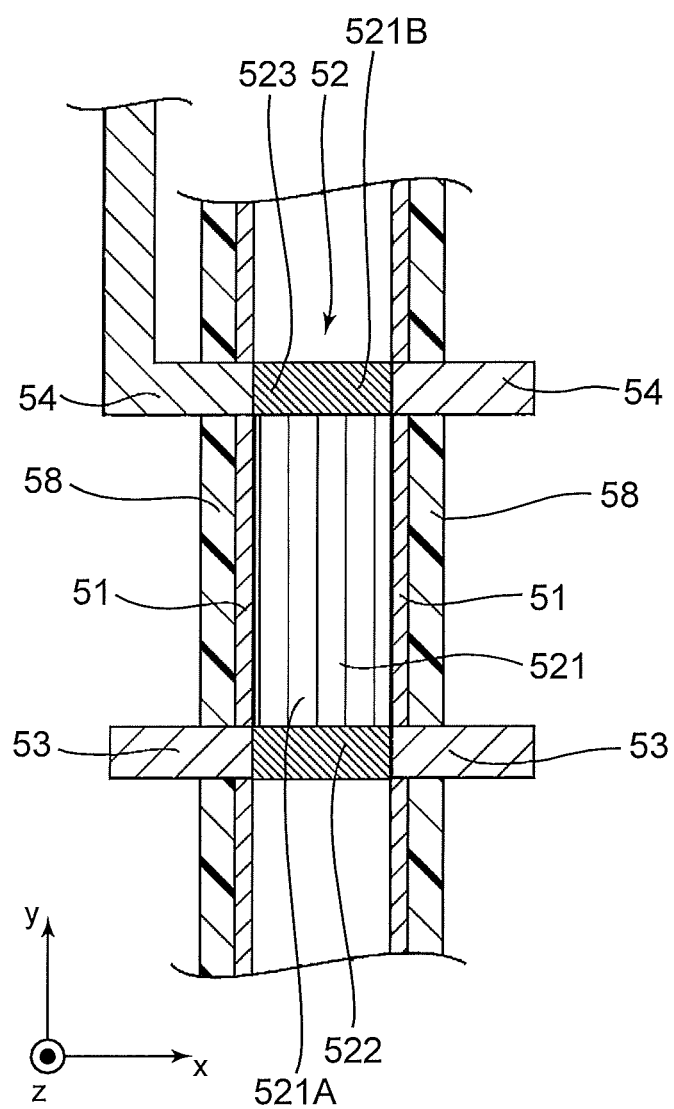
FIG. 7 is a plan sectional view of a second prime mover shown in FIG. 6.

FIG. 7 is a plan sectional view of the second prime mover 52 shown in FIG. 6. FIG. 7 is equivalent to a view obtained by cutting a region where the second prime mover 52 of the second thermoacoustic cooling device 50 shown in FIG. 6 is arranged, along a plane parallel to the xy-plane.

As shown in FIG. 7, the heat insulating material 58 covers an outer periphery of the second acoustic tube 51. The heat insulating material 58 is formed of an adiabatic material. Incidentally, the second driving heat conductor 53, the second reference heat conductors 54 and 57, and the second cooling heat conductor 56 may also be covered with the heat insulating material 58.

The second prime mover 52 is equipped with a stack 521, a second heater 522 and a reference temperature adjuster 523. Incidentally, the stack 521, the second heater 522 and the reference temperature adjuster 523 may be either integral with one another or separate from one another. The stack 521 exchanges heat with the gas in the second acoustic tube 51. The stack 521 is identical in structure to the stack 421, so detailed description thereof will be omitted.

The second heater 522 is a disc-shaped member having an outer diameter equal to an inner diameter of the second acoustic tube 51, and is provided at one end 521A of the stack 521. One end 521A is an end portion of the stack 521 in the opposite direction of the positive direction of the y-axis. The second heater 522 is identical in structure to the first heater 422, so detailed description thereof will be omitted. An outer peripheral lateral surface of the second heater 522 is in contact with the second driving heat conductor 53, so the second prime mover 52 is thermally connected to the heat source 20 via the second driving heat conductor 53.

The reference temperature adjuster 523 is a disc-shaped member having an outer diameter equal to the inner diameter of the second acoustic tube 51, and is provided at the other end 521B of the stack 521. The other end 521B is an end portion of the stack 521 in the positive direction of y-axis. The reference temperature adjuster 523 is identical in structure to the reference temperature adjuster 423, so detailed description thereof will be omitted. An outer peripheral lateral surface of the reference temperature adjuster 523 is in contact with the second reference heat conductor 54, so the second prime mover 52 is thermally connected to the reference heat source 73 via the second reference heat conductor 54.

Figure 8:
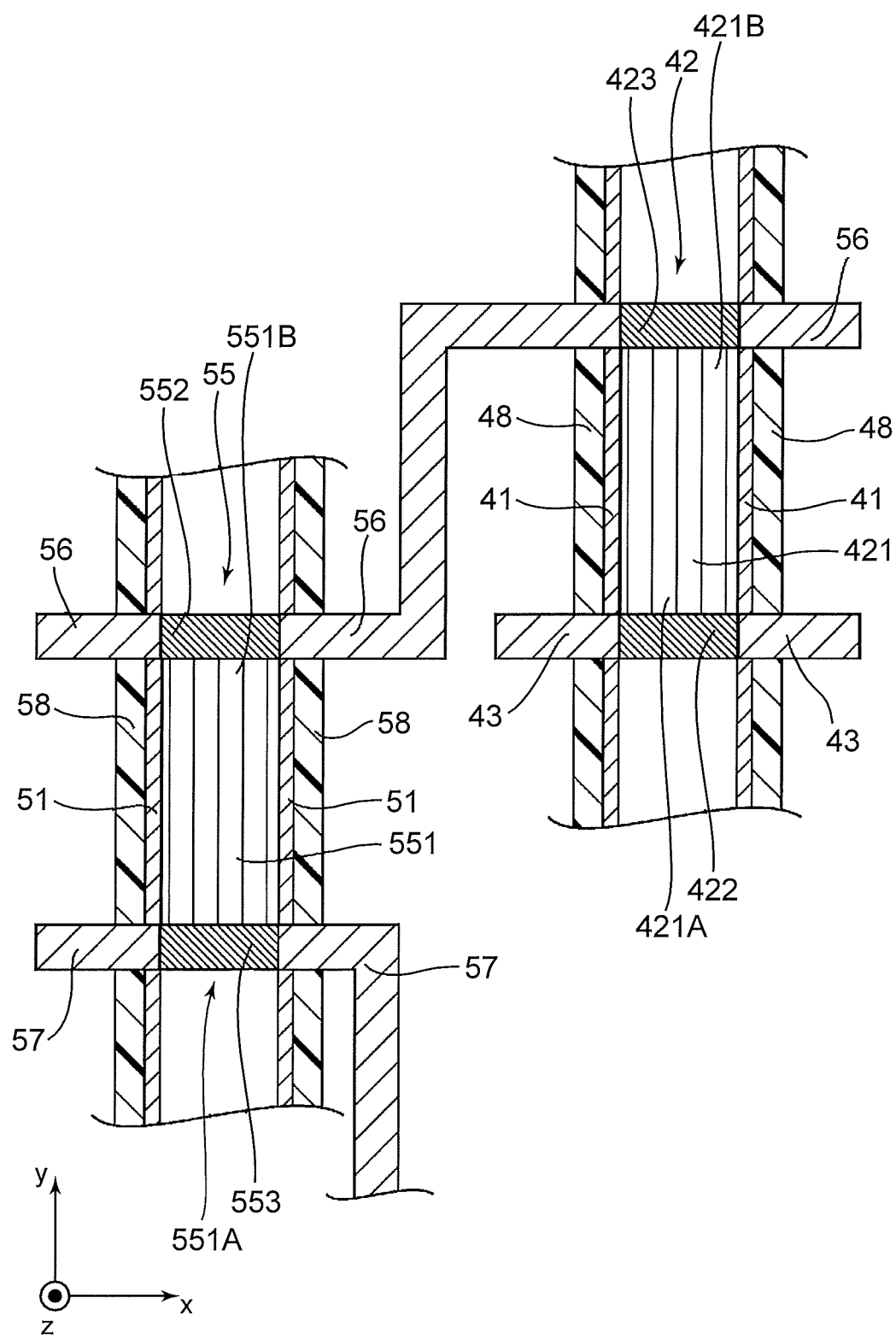
FIG. 8 is a plan sectional view of a first prime mover shown in FIG. 6 and a second receiver shown in FIG. 6.

FIG. 8 is a plan sectional view of the first prime mover 42 shown in FIG. 6 and the second receiver 55 shown in FIG. 6. FIG. 8 is equivalent to a view obtained by cutting a region where the first prime mover 42 of the first thermoacoustic cooling device 40 shown in FIG. 6 is arranged, and a region where the second receiver 55 of the second thermoacoustic cooling device 50 is arranged, along a plane parallel to the xy-plane.

The second receiver 55 is equipped with a stack 551, a second cooler 552, and a reference temperature adjuster 553. Incidentally, the stack 551, the second cooler 552 and the reference temperature adjuster 553 may be either integral with one another or separate from one another. The stack 551 exchanges heat with the gas in the second acoustic tube 51. The stack 551 is identical to the stack 421, so detailed description thereof will be omitted.

The reference temperature adjuster 553 is a disc-shaped member having an outer diameter equal to the inner diameter of the second acoustic tube 51, and is provided at one end 551A of the stack 551. One end 551A is an end portion of the stack 551 in the opposite direction of the positive direction of the y-axis. The reference temperature adjuster 553 is identical in structure to the reference temperature adjuster 423, so detailed description thereof will be omitted. An outer peripheral lateral surface of the reference temperature adjuster 553 is in contact with the second reference heat conductor 57, so the second receiver 55 is thermally connected to the reference heat source 74 via the second reference heat conductor 57.

The second cooler 552 is a disc-shaped member having an outer diameter equal to the inner diameter of the second acoustic tube 51, and is provided at the other end 551B of the stack 551. The other end 551B is an end portion of the stack 551 in the positive direction of the y-axis. The second cooler 552 is identical in structure to the first heater 422, so detailed description thereof will be omitted. The second cooling heat conductor 56 is in contact with the outer peripheral lateral surface of the second cooler 552, and the outer peripheral lateral surface of the reference temperature adjuster 423 of the first prime mover 42. That is, in the present embodiment of the disclosure, the reference temperature adjuster 423 of the first prime mover 42 is thermally connected to the second cooler 552 of the second thermoacoustic cooling device 50 by the second cooling heat conductor 56, instead of being thermally connected to the reference heat source 71.

{Operation of Second Thermoacoustic Cooling Device 50}

As shown in FIGS. 5 and 7, in the second thermoacoustic cooling device 50, the second driving heat conductor 53 thermally connects the heat source 20 and the second heater 522 of the second prime mover 52 to each other. The second heater 522 heats one end 521A of the stack 521 that is provided with the second heater 522, by being supplied with the heat whose temperature is capable of melting the solder, from the heat source 20. For example, when the temperature of the heat source 20 is equal to 250° C., one end 521A of the stack 521 is heated to 250° C. On the other hand, the second reference heat conductor 54 supplies the reference temperature adjuster 523 with the heat from the reference heat source 73. Thus, the reference temperature adjuster 523 adjusts the temperature of the other end 521B of the stack 521 to the second reference temperature (e.g., 25° C.). As a result, as is the case with the first prime mover 42, the second prime mover 52 converts the heat transmitted from the heat source 20 into acoustic waves, through the use of the thermoacoustic phenomenon.

The oscillation (acoustic waves) of gas molecules that occurs in the second prime mover 52 is transmitted to the second receiver 55. The second receiver 55 cools the second cooler 552 shown in FIG. 8 on the same principle as the principle on which the first receiver 45 cools the first cooler 452. In the second receiver 55, the temperature of the reference temperature adjuster 553 is adjusted to the temperature of the reference heat source 74. As a result, in the second receiver 55, the second cooler 552 is cooled to a temperature that is lower than the temperature of the reference heat source 74 by about 15° C., as is the case with the first cooler 452 of the first thermoacoustic cooling device 40. For example, when the temperature of the reference heat source 74 is equal to 25° C., the second cooler 552 is cooled to about 10° C.

As shown in FIG. 8, the second cooler 552 is thermally connected to the reference temperature adjuster 423 of the first prime mover 42 via the second cooling heat conductor 56. Accordingly, the reference temperature adjuster 423 is cooled to a temperature that is lower than the temperature of the reference heat source 74. As in the aforementioned example, when the temperature of the reference heat source 74 is equal to 25° C., the reference temperature adjuster 423 is cooled to about 10° C.

As described above, in the first embodiment of the disclosure, the temperature of the reference temperature adjuster 423 of the first prime mover 42 (see FIG. 3) is adjusted to the first reference temperature of the reference heat source 71. Accordingly, when the first reference temperature is equal to 25° C., the temperature of the other end 421B of the stack 421 at which the reference temperature adjuster 423 is provided is adjusted to 25° C. In the first prime mover 42, the temperature of one end 421A of the stack 421 at which the first driving heat conductor 43 is provided is a temperature resulting from the heat from the heat source 20. Accordingly, for example, when the temperature of the heat source 20 is equal to 250° C., the difference in temperature between one end 421A of the stack 421 and the other end 421B thereof is about 225° C.

On the other hand, in the second embodiment of the disclosure, the reference temperature adjuster 423 of the first prime mover 42 is cooled to 10° C. by the second cooler 552 as described above. As a result, in the second embodiment of the disclosure, the difference in temperature between one end 421A of the stack 421 and the other end 421B thereof is about 240° C., which is higher than the difference in temperature (about 225° C.) in the first embodiment of the disclosure. When the first thermoacoustic cooling device 40 and the second thermoacoustic cooling device 50 are used in combination with each other, the temperature gradient of the stack 421 can be made steeper than when only the first thermoacoustic cooling device 40 is used.

The gas molecules oscillate in the through-holes of the stack 421, but the amplitude of the gas molecules increases as the steepness of the temperature gradient increases. As the amplitude of the gas molecules increases, the amount of heat exchange between the gas molecules and the stack 451 increases, so the temperature gradient of the stack 451 of the first receiver 45 can be made steep. As a result, the cooling effect of the first receiver 45 is enhanced. Therefore, the temperature of the first cooler 452 can be made lower than the temperature (10° C.) in the first embodiment of the disclosure. Accordingly, the semiconductor device 9 heated by the heat from the heat source 20 can be more effectively cooled.

As described hitherto, the conveying device 200 according to the second embodiment of the disclosure is equipped with the first thermoacoustic cooling device 40 and the second thermoacoustic cooling device 50, and hence can further cool the cooling portion 30 without using a heat source other than the heat source 20. Accordingly, the cooling portion 30 can be more efficiently cooled.

Besides, the second acoustic tube 51 is covered with the heat insulating material 58. The heat insulating material 58 prevents the temperature of the gas molecules encapsulated in the second acoustic tube 51 from rising due to the heat from the heat source 20. When the temperature of the gas molecules rises, the speed of the sound generated in the second acoustic tube 51 changes. The wavelength of the sound generated in the second acoustic tube 51 changes in accordance with the speed of the sound, so the temperature of the second cooler 552 may not fall to a desired temperature due to the rise in the temperature of the gas molecules. The temperature of the gas molecules encapsulated in the second acoustic tube 51 is restrained from rising, by covering the second acoustic tube 51 with the heat insulating material 58. Therefore, the performance of the second thermoacoustic cooling device 50 can be maintained.

Modification Examples

Figure 9:
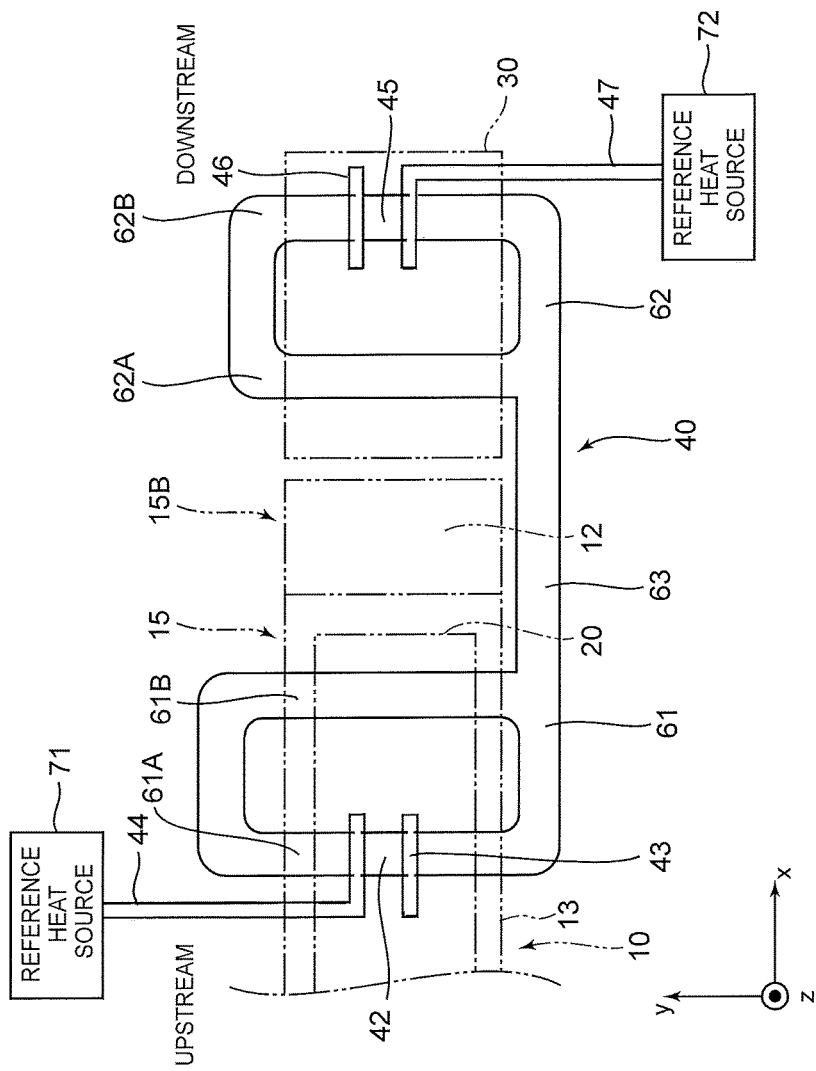
FIG. 9 is a plan sectional view of a modification example of the first thermoacoustic cooling device shown in FIG. 2.

In each of the aforementioned embodiments of the disclosure, the case where the first thermoacoustic cooling device 40 is a thermoacoustic engine that is equipped with a single loop tube has been described. However, the first thermoacoustic cooling device 40 may be a thermoacoustic engine that is equipped with two loop tubes. FIG. 9 is a plan view of the first thermoacoustic cooling device 40 in the case where the first thermoacoustic cooling device 40 is a thermoacoustic engine that is equipped with two loop tubes.

As shown in FIG. 9, the first thermoacoustic cooling device 40 is equipped with a first loop tube 61, a second loop tube 62, and a connection tube 63. The first prime mover 42 is arranged in the first loop tube 61. The first receiver 45 is arranged in the second loop tube 62. The connection tube 63 connects the first loop tube 61 and the second loop tube 62 to each other. Each of the first loop tube 61, the second loop tube 62 and the connection tube 63 is an acoustic tube in which nitrogen, argon, helium or the like is encapsulated.

The first loop tube 61 is arranged parallel to the xy-plane. The first loop tube 61 extends in the y-axis direction, and is equipped with intersection portions 61A and 61B that intersect with the endless belt 13. The intersection portions 61A and 61B are arranged in such a manner as to pass below the heat source 20, and pass through the inner space of the belt conveyor 10. The intersection portion 61A is arranged at a position closer to the head pulley 11 than the intersection portion 61B, and the intersection portion 61B is arranged at a position closer to the tail pulley 12 than the intersection portion 61A. The first prime mover 42 is arranged at the intersection portion 61A in such a manner as to be located in the inner space of the belt conveyor 10.

The second loop tube 62 is arranged parallel to the xy-plane. The second loop tube 62 extends in the y-axis direction, and is equipped with non-intersection portions 62A and 62B that pass below the cooling portion 30. The non-intersection portion 62A is arranged at a position closer to the tail pulley 12 than the non-intersection portion 62B, and the non-intersection portion 62B is arranged at a position further from the tail pulley 12 than the non-intersection portion 62A. The first receiver 45 is arranged at the non-intersection portion 62B in such a manner as to be located below the cooling portion 30. The connection tube 63 is arranged in such a manner as to extend in the x-axis direction, outside the inner space of the endless belt 13.

As described hitherto, in the case of a thermoacoustic cooling engine that is equipped with two loop tubes, the acoustic waves generated in the prime mover 42 are transmitted from the first loop tube 61 to the connection tube 63, and are further transmitted from the connection tube 63 to the second loop tube 62. The first receiver 45 that is provided in the second loop tube 62 generates, from the acoustic waves transmitted to the second loop tube 62, cooling heat corresponding to a cooling temperature that is lower than the temperature of the heat source 20, through the use of the thermoacoustic phenomenon.

That is, the first thermoacoustic cooling device 40 may be equipped with an acoustic tube having at least one annular structure. In concrete terms, the first thermoacoustic cooling device 40 shown in FIG. 9 is considered to have two annular structures, namely, the loop tubes 61 and 62. The first prime mover 42 may be arranged in the acoustic tube in such a manner as to be located below the conveying portion 15. The first receiver 45 may be arranged in the acoustic tube in such a manner as to be located downstream of the terminal end of the belt conveyor 10.

In each of the aforementioned embodiments of the disclosure, the example in which the second thermoacoustic cooling device 50 is a thermoacoustic engine that is equipped with a single loop tube has been described. However, the second thermoacoustic cooling device 50 may be a thermoacoustic engine that is equipped with two loop tubes, as is the case with the first thermoacoustic cooling device 40. In this case, the second prime mover 52 and the second receiver 55 may be arranged in the thermoacoustic tube in such a manner as to be located below the conveying portion 15.

In each of the aforementioned embodiments of the disclosure, the example in which both the first prime mover 42 and the second prime mover 52 are thermally connected to the heat source 20 has been described. However, the first prime mover 42 and the second prime mover 52 may be thermally connected to separate heat sources respectively.

In each of the aforementioned embodiments of the disclosure, the example in which the conveying device 100 is a reflow device of the semiconductor device 9 has been described, but the disclosure is not limited thereto. As long as each of the conveying devices 100 and 200 heats an object conveyed by the belt conveyor 10, with the aid of the heat source 20, and cools the heated object, the intended purpose thereof is not limited in particular.

Besides, each of the conveying devices 100 and 200 may not heat an object in conveying the object on the belt conveyor 10. Each of the conveying devices 100 and 200 may be a device that cools an object after conveying the object on the belt conveyor 10. In this case, a motor that drives the belt conveyor 10 or the like can be used as the heat source 20.

Incidentally, in each of the aforementioned embodiments of the disclosure, the example in which the conveying portion 15 is constituted by the belt conveyor 10 has been described, but the disclosure is not limited thereto. Means other than the belt conveyor 10 may be used as the conveying portion 15 as long as an object can be conveyed from the upstream region to the downstream region.

Besides, in each of the aforementioned embodiments of the disclosure, the example in which the first driving heat conductor 43, the first reference heat conductors 44 and 47, the first cooling heat conductor 46, the second driving heat conductor 53, the second reference heat conductors 54 and 57, and the second cooling heat conductor 56 are formed of the metal exhibiting high heat conductivity has been described, but the disclosure is not limited thereto. These heat conductors may be pipes for circulating a liquid such as oil phase etc., or the like.

Besides, in each of the aforementioned embodiments of the disclosure, the example in which each of the first acoustic tube 41 and the second acoustic tube 51 is covered with the heat insulating material has been described, but the disclosure is not limited thereto. Each of the first acoustic tube 41 and the second acoustic tube 51 may not be covered with the heat insulating material.

Besides, in each of the aforementioned embodiments of the disclosure, the example in which the cooling portion 30 is a pedestal on which the object (the semiconductor device 9) is to be placed has been described, but the disclosure is not limited thereto. As long as the cooling portion 30 is cooled by the cooling heat generated by the first receiver 45 and can cool an object, the shape of the cooling portion 30 is not limited in particular.

What is claimed is:

1. A conveying device comprising:
   a conveying portion that conveys an object from an upstream region to a downstream region;
   a first heat source that heats the object conveyed by the conveying portion;
   a cooling portion that is located downstream of a terminal end of the conveying portion in a case where a downstream direction is defined as a direction from a leading end of the conveying portion toward the terminal end thereof, and that cools the object conveyed by the conveying portion; and
   a first thermoacoustic cooling device that cools the cooling portion, wherein
   the first thermoacoustic cooling device is equipped with a first prime mover configured such that acoustic waves are generated from heat transmitted from the first heat source, and a first receiver configured such that, from the acoustic waves, cooling heat corresponding to a cooling temperature that is lower than a temperature of the first heat source is generated, and
   the cooling portion is cooled by the cooling heat.

2. The conveying device according to claim 1, wherein
   the first heat source is arranged below the conveying portion,
   the first thermoacoustic cooling device is equipped with a first driving heat conductor that is thermally connected to the first heat source, a first cooling heat conductor that is thermally connected to the cooling portion, and a first acoustic tube having at least one annular structure,
   the first prime mover is arranged in the first acoustic tube in such a manner as to be located below the conveying portion and the first prime mover is equipped with a first prime mover stack that exchanges heat with a gas in the first acoustic tube, a first heater that is provided at one end of the first prime mover stack and that is thermally connected to the first driving heat conductor, and a first prime mover reference temperature adjuster that is provided at the other end of the first prime mover stack and whose temperature is adjusted to a first reference temperature that is lower than a temperature of the first heat source, and the first receiver is arranged in the first acoustic tube in such a manner as to be located below the conveying portion and the first receiver is equipped with a first receiver stack that exchanges heat with the gas in the first acoustic tube, a first receiver reference temperature adjuster that is provided at one end of the first receiver stack, and a first cooler that is provided at the other end of the first receiver stack and that is thermally connected to the first cooling heat conductor.

3. The conveying device according to claim 2, wherein an outer periphery of the first acoustic tube is covered with a heat insulating material.

4. The conveying device according to claim 2, further comprising:

a second heat source that is arranged below the conveying portion and that heats the object conveyed by the conveying portion; and a second thermoacoustic cooling device that adjusts a temperature of the first prime mover reference temperature adjuster to the first reference temperature, wherein the second thermoacoustic cooling device is equipped with a second driving heat conductor that is thermally connected to the second heat source, a second cooling heat conductor that is thermally connected to the first prime mover reference temperature adjuster, a second acoustic tube having at least one annular structure, a second prime mover that is arranged in the second acoustic tube in such a manner as to be located below the conveying portion, and a second receiver that is arranged in the second acoustic tube in such a manner as to be located below the conveying portion, the second prime mover is equipped with a second prime mover stack that exchanges heat with a gas in the second acoustic tube, a second heater that is provided at one end of the second prime mover stack and that is thermally connected to the second driving heat conductor, and a second prime mover reference temperature adjuster that is provided at the other end of the second prime mover stack and whose temperature is adjusted to a second reference temperature that is lower than a temperature of the second heat source, and the second receiver is equipped with a second receiver stack that exchanges heat with a gas in the second acoustic tube, a second receiver reference temperature adjuster that is provided at one end of the second receiver stack, and a second cooler that is provided at the other end of the second receiver stack and that is thermally connected to the second cooling heat conductor.

5. The conveying device according to claim 4, wherein an outer periphery of the second acoustic tube is covered with a heat insulating material.

6. The conveying device according to claim 2, further comprising:

a second thermoacoustic cooling device that adjusts a temperature of the first prime mover reference temperature adjuster to the first reference temperature, wherein the second thermoacoustic cooling device is equipped with a second driving heat conductor that is thermally connected to the first heat source, a second cooling heat conductor that is thermally connected to the first prime mover reference temperature adjuster, a second acoustic tube having at least one annular structure, a second prime mover that is arranged in the second acoustic tube in such a manner as to be located below the conveying portion, and a second receiver that is arranged in the second acoustic tube in such a manner as to be located below the conveying portion, the second prime mover is equipped with a second prime mover stack that exchanges heat with a gas in the second acoustic tube, a second heater that is provided at one end of the second prime mover stack and that is thermally connected to the second driving heat conductor, and a second prime mover reference temperature adjuster that is provided at the other end of the second prime mover stack and whose temperature is adjusted to a second reference temperature that is lower than a temperature of the first heat source, and the second receiver is equipped with a second receiver stack that exchanges heat with the gas in the second acoustic tube, a second receiver reference temperature adjuster that is provided at one end of the second receiver stack, and a second cooler that is provided at the other end of the second receiver stack and that is thermally connected to the second cooling heat conductor.

7. The conveying device according to claim 6, wherein an outer periphery of the second acoustic tube is covered with a heat insulating material.

8. The conveying device according to claim 1, wherein the first heat source is arranged between the first prime mover and the conveying portion.

* * * * *